(12) United States Patent
Park et al.

(10) Patent No.: US 7,859,879 B2
(45) Date of Patent: Dec. 28, 2010

(54) MEMORY MODULE

(75) Inventors: Sung-Joo Park, Anyang-si (KR);
Kyoung-Sun Kim, Uijeongbu-si (KR);
Young-Ho Lee, Yongin-si (KR);
Jea-Eun Lee, Seoul (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 191 days.

(21) Appl. No.: 12/292,700

(22) Filed: Nov. 24, 2008

(65) Prior Publication Data

US 2009/0154212 A1 Jun. 18, 2009

(30) Foreign Application Priority Data

Nov. 22, 2007 (KR) ............... 10-2007-0119830

(51) Int. Cl.
*G11C 5/00* (2006.01)
(52) U.S. Cl. ............ 365/51; 365/63; 365/191; 365/194; 365/210.11; 365/230.03
(58) Field of Classification Search ........... 365/51, 365/63, 191, 194, 210.11, 230.03
See application file for complete search history.

(56) References Cited

U.S. PATENT DOCUMENTS

| 5,272,664 | A | * | 12/1993 | Alexander et al. | ........... 365/52 |
|---|---|---|---|---|---|
| 7,289,383 | B2 | * | 10/2007 | Cornelius | ........... 365/226 |
| 2002/0038461 | A1 | | 3/2002 | White et al. | |
| 2002/0161968 | A1 | * | 10/2002 | Yoo et al. | ........... 711/105 |
| 2007/0255983 | A1 | | 11/2007 | Funaba et al. | |

FOREIGN PATENT DOCUMENTS

| JP | 63-211053 | | 9/1988 |
|---|---|---|---|
| KR | 10-2001-0082537 | A | 8/2001 |
| KR | 10-2003-0023861 | A | 3/2003 |

* cited by examiner

*Primary Examiner*—Hoai V Ho
(74) *Attorney, Agent, or Firm*—Lee & Morse, P.C.

(57) ABSTRACT

A memory module, includes a memory module board and a plurality of memory devices on the memory module board. The memory module board includes one or more first input terminals configured to receive first signals to individually control the memory devices, and one or more second input terminals configured to receive second signals to commonly control the memory devices. Each of the memory devices includes a plurality of first signal input units configured to receive the first signals through one or more first input pins, a plurality of second signal input units configured to receive the second signals through one or more second input pins, and a plurality of dummy units, the dummy units being respectively connected to the first signal input units in parallel, and being configured to receive the first signals through one or more third input pins and to compensate for a signal line load.

15 Claims, 3 Drawing Sheets

MEMORY MODULE

BACKGROUND

1. Technical Field

Embodiments relate to a memory module.

2. Description of the Related Art

As the operating speeds of computer and network systems increase, memories such as dynamic random access memories (DRAMs) require high speed and high capacity. In a computer system, a central processing unit (CPU) may be coupled, e.g., using a memory controller, to a memory such as dynamic random access memory. The memory may be configured as a memory module, which may be inserted into a slot formed on a printed circuit board (PCB) such as a motherboard.

In the memory system, the memory controller and the memory module may be electrically connected through a transmission line formed on the PCB. The operating speed is determined by a data input/output frequency and an operating frequency of a command signal and an address signal. In general, since the command signal and the address signal of the memory system have a larger load than a data signal, a maximum operating frequency may be determined by the command and/or address signal line topology.

As the operating speed of the memory system has increased, the signal line topology has changed to enable high-speed operation. One topology is a fly-by topology. This topology configures channels in the form of a daisy chain and may improve signal line characteristics through impedance matching by connecting loads through a short stub.

The number of loads connected to each signal line of memory modules configured with a plurality of ranks differs according to types of the signal lines. Further, in the fly-by topology, a signal arrival time depends upon the number of loads. Since the number of loads differs according to signal characteristics, a signal transfer time difference occurs according to types of signals.

Since a difference of the signal transfer time from the memory controller to each load increases when the number of loads mounted in the memory module increases, a data setup time and a hold time may be accumulated. Thus, a data window corresponding to a valid interval of delayed and transferred data may be reduced, and skew may cause malfunctions.

In the case of a point-to-point (PTP) connection between memory modules that enables the conventional memory system to operate at high speed, the number of pins of the memory module tends to increase. However, in order to make personal computers and electronic devices compact, lightweight and mechanically efficient, memory modules often cannot be designed to have 250 or more pins. Thus, to meet design limits on the number of pins, the number of memories in the memory module may have to be reduced, resulting in a reduction in data processing capacity.

SUMMARY

Embodiments are therefore directed to a memory module, which substantially overcomes one or more of the problems due to the limitations and disadvantages of the related art.

It is therefore a feature of an embodiment to provide a memory module that may prevent skew between signals by compensating for a difference in signal transfer time using a dummy input buffer and existing pins.

At least one of the above and other features and advantages may be realized by providing a memory module, including a memory module board and a plurality of memory devices on the memory module board. The memory module board may include one or more first input terminals configured to receive first signals to individually control the memory devices, and one or more second input terminals configured to receive second signals to commonly control the memory devices. Each of the memory devices may include a plurality of first signal input units configured to receive the first signals through one or more first input pins, a plurality of second signal input units configured to receive the second signals through one or more second input pins, and a plurality of dummy units, the dummy units being respectively connected to the first signal input units in parallel, and being configured to receive the first signals through one or more third input pins and to compensate for a signal line load. The one or more first input terminals of the memory module board may be commonly connected to the one or more first input pins of each of the memory devices as well as the one or more second input pins of each of the memory devices through a plurality of first signal lines, and the one or more second input terminals of the memory module board may be connected to the one or more third input pins of each of the memory devices through a plurality of second signal lines.

The one or more first input terminals of the memory module board may receive the first signals from a memory controller, the one or more second input terminals of the memory module board may receive the second signals from the memory controller, the first signal lines transfer the first signals to the one or more first input pins and the one or more second input pins of each of the memory devices using two paths via the one or more first input terminals, and the second signal lines may transfer the second signals to the one or more third input pins of each of the memory devices using one path via the one or more second input terminals.

The one or more first input pins and the one or more third input pins may be first and second control signal pins, and the one or more second input pins may use no connect (NC) input/output signal pins disposed adjacent to the first control signal pins.

The first signal lines may act as a delay capacitance that compensates for a signal transfer time difference of the first signals and the second signals.

The first signals may be connected from the memory controller according to memory rank, and the second signals may be connected from the memory controller to each memory device of the plurality of memory devices.

The memory module may further include a plurality of termination resistors. The termination resistors may be commonly connected to the one or more first input terminals or the one or more second input terminals.

At least one of the above and other features and advantages may also be realized by providing a memory module, including a memory module board, and a plurality of memory packages on the memory module board, each of the memory packages including one or more first solder balls, one or more second solder balls, and a plurality of memory devices. The memory module board may include one or more first input terminals configured to receive first signals to individually control the memory devices, and one or more second input terminals configured to receive second signals to commonly control the memory devices. Each of the memory devices may include a plurality of first signal input units configured to receive the first signals through one or more first input pins, a plurality of second signal input units configured to receive the second signals through one or more second input pins, and a plurality of dummy units, the dummy units being respectively connected to the first signal input units in parallel and being configured to receive the first signals through one or more third input pins and to compensate for a signal line load. The one or more first input terminals may be commonly connected to the one or more first input pins and the one or more second input pins through a plurality of first signal lines, the one or more first solder balls, and a plurality of second signal lines. The one or more second input terminals may be connected to the one or more third input pins through a plurality of third signal lines, the one or more second solder balls, and a plurality of fourth signal lines.

The one or more first input terminals of the memory module board may be configured to receive the first signals from a memory controller, the one or more second input terminals of the memory module board may be configured to receive the second signals from the memory controller, the first signal lines may be configured to transfer the first signals to the one or more first solder balls of the memory packages via the one or more first input terminals, and the third signal lines may be configured to transfer the second signals to the one or more second solder balls of the memory packages via the one or more second input terminals.

The one or more first solder balls of each of the memory packages may be configured to receive the first signals, the one or more second solder balls of each of the memory packages may be configured to receive the second signals, the second signal lines may be included in each of the memory packages and may be configured to transfer the first signals to two paths via the one or more first solder balls, and the fourth signal lines may be included in each of the memory packages and may be configured to transfer the second signals to each of the memory devices using one path via the one more second solder balls.

The one or more first solder balls and the one or more third solder balls may be first and second control signal balls, and the one or more second solder balls may use NC input/output signal balls disposed adjacent to the first control signal balls.

The one or more first input pins and the one or more third input pins may be first and second control signal pins, and the one or more second input pins may use NC input/output signal pins disposed adjacent to the first control signal pins.

The second signal lines may act as a delay capacitance that compensates for a signal transfer time difference of the first signals and the second signals.

Each of the memory packages may be configured as a package other than a ball grid array package.

The first signals may be connected from the memory controller according to memory rank, and the second signals may be connected from the memory controller to all of the memory devices of the plurality of memory devices.

The memory module may further include a plurality of termination resistors. The termination resistors may be commonly connected to the one or more first input terminals or the one or more second input terminals.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE EMBODIMENTS

Figure 1:
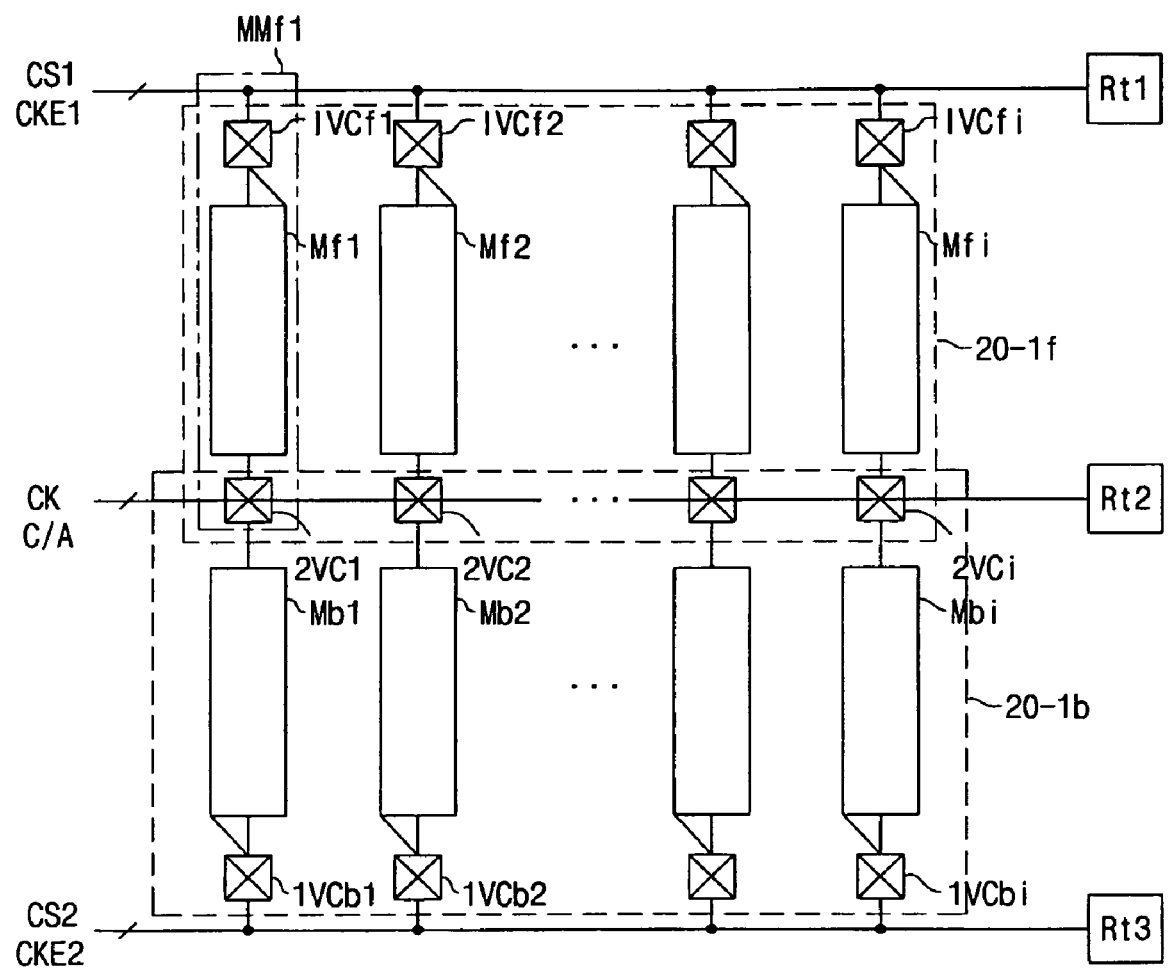
FIG. 1 illustrates a schematic diagram of a double rank memory module 50-1' according to a first example embodiment.

Korean Patent Application No. 10-2007-0119830, filed on Nov. 22, 2007, in the Korean Intellectual Property Office, and entitled: "Memory Module," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A memory module according to example embodiments will be described with reference to the accompanying drawings.

FIG. 1 illustrates a schematic diagram of a double rank memory module 50-1' according to a first embodiment. The double rank memory module 50-1' may include a first memory device 20-1$f$ placed on an upper portion, a second memory device 20-1$b$ placed on a lower portion, and a plurality of termination resistors Rt1 to Rt3. The first memory device 20-1$f$ may include a plurality of first semiconductor memory devices Mf1 to Mfi, a plurality of first via contacts 1VCf1 to 1VCfi, and a plurality of second via contacts 2VC1 to 2VCi. The second memory device 20-1$b$ may include a plurality of second semiconductor memory devices Mb1 to Mbi, a plurality of via contacts 1VCb1 to 1VCbi, and a plurality of second via contacts 2VC1 to 2VCi.

A first chip select signal CS1 and a first clock enable signal CKE1 among control signals output from a memory controller (not shown) may be applied to the first memory device 20-1$f$, e.g., through respective signal lines. A second chip select signal CS2 and a second clock enable signal CKE2 may be applied to the second memory device 20-1$b$, e.g., through respective signal lines. A clock signal CK and a command/address signal C/A may each be commonly applied to the first memory device 20-1$f$ and the second memory device 20-1$b$, e.g., through one signal line.

The first and second semiconductor memory devices Mf1 to Mfi and Mb1 to Mbi may simultaneously receive rank-wise connected signals from the memory controller to first and second input terminals through the first via contacts 1VCf1 to 1VCfi and 1VCb1 to 1VCbi.

Functions of blocks of the double rank memory module within the memory system will now be described.

Referring to FIG. 1, the first and second via contacts 1VCf1 to 1VCfi, 1VCb1 to 1VCbi, and 2VC1 to 2VCi may receive rank-wise connected signals CS1, CKE1, CS2, and CKE2 output from the memory controller, may receive signals CK and C/A connected to all memory modules, and may transfer the signals to the pluralities of first and second semiconductor memory devices Mf1 to Mfi and Mb1 to Mbi.

The pluralities of first and second semiconductor memory devices Mf1 to Mfi and Mb1 to Mbi may receive the rank-wise connected signals CS1, CKE1, CS2, and CKE2 through the first and second input terminals, and may receive the signals CK and C/A connected to all the memory modules through third input terminals, thereby reading and writing data in response to the control signals CS, CKE, CK, and C/A.

Each of the termination resistors Rt1 to Rt3 may be commonly connected to the first or second via contacts 1VCf1 to 1VCfi, 1VCb1 to 1VCbi, or 2VC1 to 2VCi. When the operating frequency of the first and second semiconductor memory devices Mf1 to Mfi and Mb1 to Mbi is varied, gains of the input terminals may be uniformly maintained.

Operation of the double rank memory module within the memory system will now be described.

Referring to FIG. 1, the first via contacts 1VCf1 to 1VCfi and 1VCb1 to 1VCbi of a memory module board may be connected to the first and second input terminals of the pluralities of first and second semiconductor memory devices Mf1 to Mfi and Mb1 to Mbi, e.g., through a first PCB line pattern, and may receive the rank-wise connected signals CS1, CKE1, CS2, and CKE2 output from the memory controller. The second via contacts 2VC1 to 2VCi may be connected to the third input terminals of the pluralities of first and second semiconductor memory devices Mf1 to Mfi and Mb1 to Mbi, e.g., through a second PCB line pattern, and may receive the signals CK and C/A, which are connected to all the memory modules, output from the memory controller.

The pluralities of first and second semiconductor memory devices Mf1 to Mfi and Mb1 to Mbi may receive the rank-wise connected signals CS1, CKE1, CS2, and CKE2 at the first and second input terminals through the first via contacts 1VCf1 to 1VCfi and 1VCb1 to 1VCbi, and may receive the signals connected to all the memory modules to the third terminals through the second via contacts 2VC1 to 2VCi, thereby reading and writing data in response to the control signals CS, CKE, CK, and C/A.

When the operating frequency of the semiconductor memory devices increases from a low frequency to a high frequency, the termination resistors Rt1 to Rt3, which are commonly connected to the input terminals of the first and second semiconductor memory devices Mf1 to Mfi and Mb1 to Mbi, may be used to uniformly maintain the gains at the input terminals.

Figure 2:
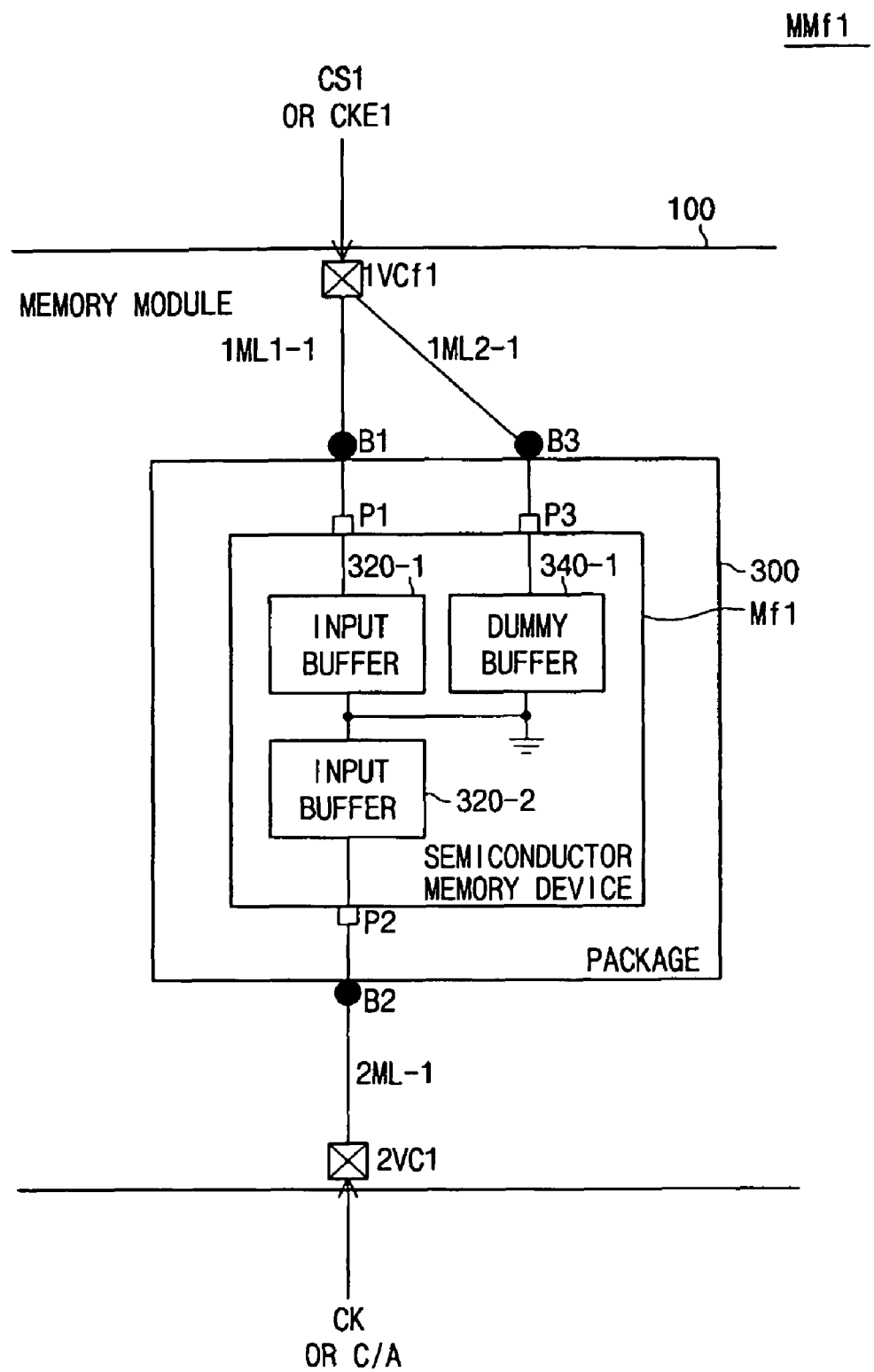
FIG. 2 illustrates a block diagram of a portion MMf1 of a mono-memory module according to a second example embodiment.

FIG. 2 illustrates a block diagram of second example embodiment, in which a portion MMf1 of the double rank memory module shown in FIG. 1 is a mono-memory module having a single via contact connected to two solder balls, and in which one of the solder balls is a no-connect solder ball.

Referring to FIG. 2, the portion MMf1 may include a memory module board 100, a memory package 300, and a semiconductor memory device Mf1. The memory module board 100 may include first and second via contacts 1VCf1 and 2VC1. The memory package 300 may include first and second control signal solder balls B1 and B2, and a no-connect (NC) solder ball B3. The semiconductor memory device Mf1 may include first and second input buffers 320-1 and 320-2, a dummy buffer 340-1, first and second control signal pins P1 and P2, and an NC pin P3. Each component may be configured with one or more elements, and the memory package 300 may be configured as a ball grid array (BGA) package or other type of package. Such other types of packages may include, e.g., types such as DIP and PGA, surface mount technology (SMT) types such as QFP and SOP, fine pitch surface mount types such as TQFP and TSOP, Chip Scale Package (CSP), Multichip Module (MCM), System-In-Package (SIP) and System-On-Package (SOP) types, etc.

The first via contact 1VCf1 of the memory module board 100 may be connected to both the first control signal solder ball B1 and the NC solder ball B3 of the memory package 300, e.g., through first PCB line patterns 1ML1-1 and 1ML2-1. The second via contact 2VC1 may be connected to the second control signal solder ball B2 of the memory package 300, e.g., through a second PCB line pattern 2ML-1.

The first control solder ball B1 may be connected to the first control signal pin P1 of the semiconductor memory device Mf1 through the line pattern 1ML1-1 of the memory package 300. The second control solder ball B2 may be connected to the second control signal pin P2 of the semiconductor memory device Mf1 through the line pattern 1ML2-1 of the memory package 300. The NC solder ball B3 may be connected to the NC pin P3 of the semiconductor memory device Mf1 through the line pattern 2ML-1 of the memory package 300.

The first control signal pin P1 may be connected to the first input buffer 320-1 within the semiconductor memory device Mf1. The second control signal pin P2 may be connected to the second input buffer 320-2 within the semiconductor memory device Mf1. The NC pin P3 may be connected to a dummy buffer 340-1 within the semiconductor memory device Mf1.

Functions of blocks of the portion MMf1 of the mono memory module will now be described.

Referring to FIG. 2, the memory module board 100 may receive rank-wise connected signals CS1 or CKE1 output from the memory controller (not shown) through the first via contact 1VCf1, and may simultaneously transfer the signals to the memory package 300 using the two paths provided by the first PCB line patterns 1ML1-1 and 1ML2-1. The memory module board 100 may receive signals CK or C/A connected to all the memory modules through the second via contact 2VC1, and may transfer the signals to the memory package 300 using the one path provided by the second PCB line pattern 2ML-1, thereby controlling a signal transfer time according to signal type and number of loads.

The memory package 300 may simultaneously receive the rank-wise connected signals CS1 or CKE1 from the memory module board 100 through the first control signal solder ball B1 and the NC solder ball B3, may receive the signals CK or C/A connected to all the memory modules through the second control signal solder ball B2, and may transfer the signals to the semiconductor memory device using the line patterns of the memory package 300.

The semiconductor memory device Mf1 may simultaneously receive the rank-wise connected signals CS1 or CKE1 from the memory package 300 through the first control signal pin P1 and the NC pin P3, and may transfer the signals to the first input buffer 320-1 and the dummy buffer 340-1, thereby controlling the signal transfer time. The semiconductor memory device Mf1 may receive the signals CK or C/A connected to all the memory modules through the second control signal pin P2, and may transfer the signals to the second input buffer 320-2, thereby reading and writing data in response to the control signals CS, CKE, CK, and C/A.

Operation of the portion MMf1 of the mono memory module will now be described.

Referring to FIG. 2, the dummy buffer 340-1 may be the same as the first input buffer 320-1. The dummy buffer 340-1 may be disposed at a position close to the first input buffer 320-1.

The dummy buffer 340-1 may be physically connected through wiring based on the number of inputs. For this, a required input terminal may use an existing input terminal, in consideration of a stack structure. Thus, the input terminal of the dummy buffer 340-1 within the semiconductor memory device may have a rank control signal in the vicinity of the first control signal pin P1 and may be connected using an NC terminal.

The first PCB line patterns 1ML1-1 and 1ML2-1 on the memory module board 100, which may electrically connect the first via contact 1VCf1 of the memory module board 100 to the first control signal solder ball B1 and the NC solder ball B3 of the memory package 300, and the line patterns on the memory package 300, which may electrically connect the first control signal solder ball B1 and the NC solder ball B3 to the respective first control signal pin P1 and NC pin P3 of the semiconductor memory device Mf1, may act as capacitance that delays a signal transfer time of the rank-wise connected signals CS1 or CKE1 output from the memory controller.

When rank-wise signals are applied in the memory system having the double rank memory module structure, and a structure is formed in which the signal line of the clock signal CK and the command/address signal C/A causing a signal transfer time difference between the memory controller and each semiconductor memory device is physically connected to two capacitors in parallel, the input capacitance viewed from the signal line may be twice as large as when only the first input buffer 320-1 is wired without the dummy buffer 340-1.

The memory module according to an example embodiment may compensate for a signal transfer time difference according to a difference in a number of semiconductor memory devices connected within the memory module, without an additional control circuit for controlling the signal transfer time, and with the memory controller within the semiconductor memory device. According to an example embodiment, the memory module may connect a dummy buffer using an existing NC terminal in the vicinity of a control signal pin as an input terminal of a semiconductor memory device. This configuration may avoid a design limitation on the number of pins of the memory module, may increase data processing capacity of the memory module, and may enable a memory system to operate at high speed.

Figure 3:
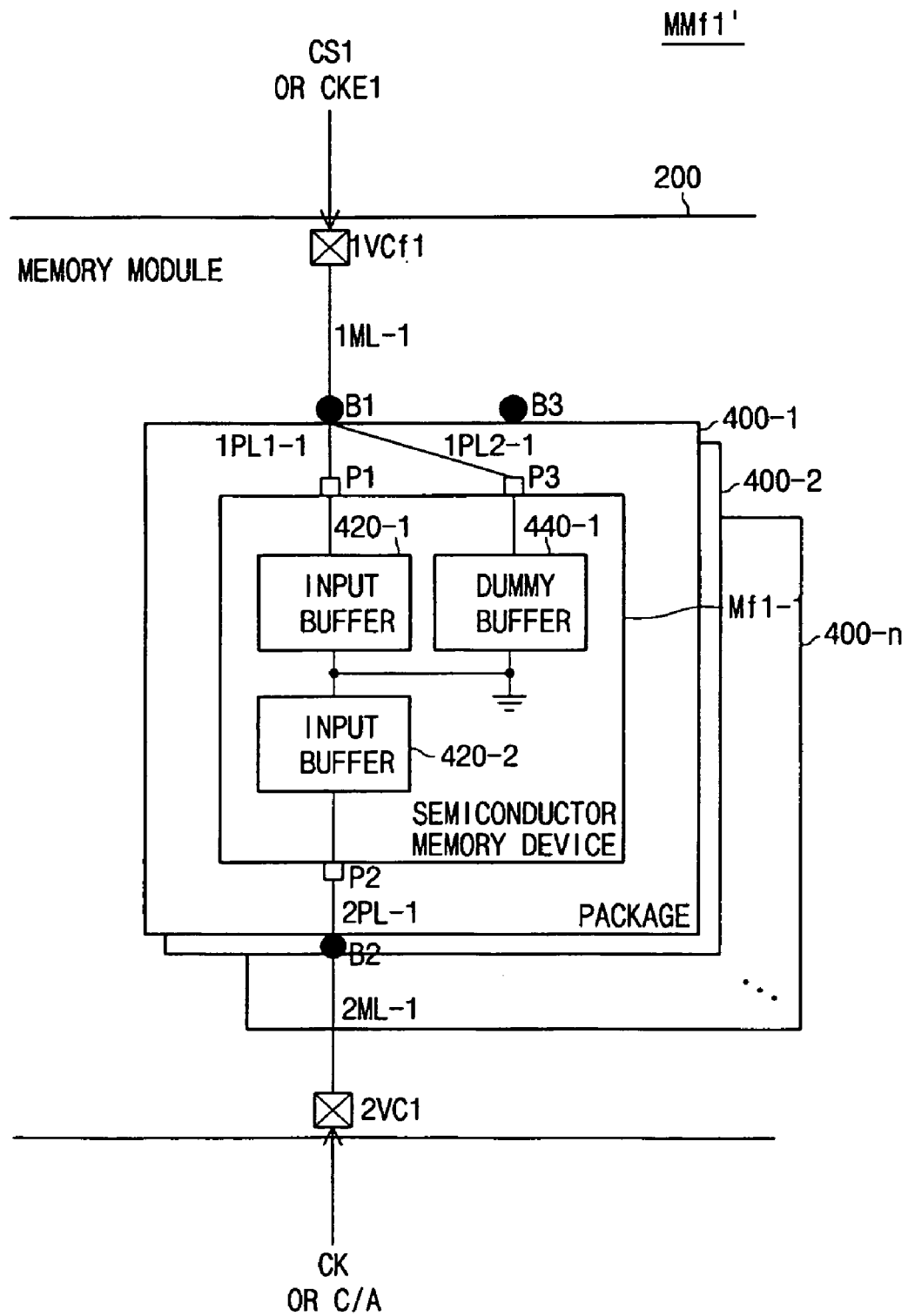
FIG. 3 illustrates a block diagram of a portion MMf1' of a stacked memory module according to a third example embodiment.

FIG. 3 illustrates a block diagram of a portion MMf1' of a stacked memory module according to a third example embodiment.

Referring to FIG. 3, the portion MMf1' of the double rank memory module shown in FIG. 1 may be a stacked memory module having a single via contact connected to a single solder ball, which in turn is connected to a control signal pin as well as a no-connect pin. Stacked semiconductor memory devices may have a "die stack" structure, in which a plurality of memory packages share a solder ball. Also, stacked semiconductor memory packages may have a "package stack" structure, in which each package of a plurality of packages has its own respective solder balls. Details of an example package stack structure will now be described.

The portion MMf1' may include a memory module board 200, a plurality of stacked memory packages 400-1 to 400n, and a plurality of semiconductor memory devices Mf1-1 to Mf1-n.

The memory module board 200 may include first and second via contacts 1VCf1 and 2VC1. Each of the memory packages 400-1 to 400-n may include first and second control signal solder balls B1 and B2, i.e., the memory package 400-1 may include first and second control signal solder balls B1 and B2, the memory package 400-2 may include first and second control signal solder balls B1 and B2, etc.

The semiconductor memory device Mf1-1 may include first and second input buffers 420-1 and 420-2, a dummy buffer 440-1, first and second control signal pins P1 and P2, and an NC pin P3. The input pins may serve as input ports at which a plurality of first and second signal input units and dummy units receive respective signals, whereas solder balls may be input/output ports that electrically connect a plurality of memory packages to a memory module board.

The semiconductor memory devices Mf1-1 to Mf1-n may be configured in a stack structure. In an implementation, none of the memory packages 400-1 to 400-n uses an NC solder ball B3.

As in the first example embodiment, each component can be configured with one or more elements. Each of the memory packages 400-1 to 400-n may be configured with, e.g., a BGA package or other type of package.

Functions of blocks of the portion MMf1' of the stacked memory module in, which the semiconductor memory device is mounted according to a third example embodiment, will be now described with reference to FIG. 3.

The memory module board 200 may receive rank-wise connected signals CS1 or CKE1, which may be provided to all the memory modules output from the memory controller (not shown) through the first via contact 1VCf1. The memory module board 200 may receive rank-wise connected signals CK or C/A, which may be provided to all the memory modules output from the memory controller, through the second via contact 2VC1. Each signal may be transferred to each of the memory packages 400-1 to 400-n by means of respective single paths formed by the first and second PCB line patterns 1ML1-1 and 2ML-1.

Each of the memory packages 400-1 to 400-n may receive the rank-wise connected signals CS1 or CKE1 from the memory module board 200 through the first control signal solder ball B1, and may transfer the signals to the semiconductor memory device Mf1-1 by means of two paths formed by first line patterns 1PL1-1 and 1PL2-1. Each of the memory packages 400-1 to 400-n may receive the signals connected to all the memory modules through the second via contact 2VC1, and may transfer the signals to the semiconductor memory device Mf1-1 by means of a single path formed by the second line pattern 2PL-1 of the package board, thereby controlling a signal transfer time according to signal type and number of loads.

A plurality of semiconductor memory devices Mf1-1 to Mf1-n may receive the rank-wise connected signals CS1 or CKE1 from the memory packets 400-1 to 400-n through the first control signal pin P1 and the NC pin P3, and may transfer the signals to the first input buffer 420-1 and the dummy buffer 440-1. Each of the semiconductor memory devices Mf1-1 to Mf1-n may receive the signals CK or C/A connected to all the memory modules through the second control signal pin P2, and may transfer the signals to the second input buffer 420-2, thereby reading and writing data in response to the control signals CS, CKE, CK, and C/A.

An operation of the portion MMf1' of the stacked memory module, in which the semiconductor memory device is mounted according to the third example embodiment, will now be described with reference to FIG. 3.

In the third example embodiment of FIG. 3, the first input buffer 420-1 and the dummy buffer 440-1 may be connected in the semiconductor memory device Mf1-1 through single path PCB line pattern. Also, the first control signal pin P1 and the NC pin P3 may be connected in the semiconductor memory device Mf1-1 through two paths formed line patterns of the package board, while using only the first control signal solder ball B1 of each of the memory packages 400-1 to 400-n, i.e., without using the NC solder ball B3 of each of the memory packages 400-1 to 400-n. Thus, the via contacts of the memory module board 200 may be connected through the first control signal solder ball B1 of each of the memory packages 400-1 to 400-n and the first PCB line pattern 1ML-1 formed as one path.

The first control signal solder ball B1 may be connected to the first control signal pin P1 and the NC pin P3 of the semiconductor memory device Mf1-1 through the first line patterns 1PL1-1 and 1PL2-1 of the package board formed as two paths. The first control signal pin P1 and the NC pin P3 may be respectively connected to the first input buffer 420-1 and the dummy buffer 440-1 within the semiconductor memory device Mf1-1.

Referring again to the semiconductor memory device Mf1-1 of the second example embodiment shown in FIG. 2, the dummy buffer 440-1 may be the same as the first input buffer 420-1, and may be placed at a position close thereto. Since an input terminal for connecting the dummy buffer 440-1 through wiring based on the number of inputs for use in the memory module or memory system may be used in the semiconductor memory device Mf1-1, no existing input terminals may be available. In the third example embodiment, however, since input terminals connected in stacked memory devices of the stacked memory module are the same as those of the mono-memory module according to the second example embodiment, a connection method on the package board in the stacked semiconductor memory device of the third example embodiment may achieve the same effect as that of the mono-memory module of the second example embodiment. Thus, in the third example embodiment shown in FIG. 3, the input terminal of the dummy buffer 440-1 within the semiconductor memory device Mf1-1 may be connected using the NC pin P3 in the vicinity of the first control signal pin P1.

The line patterns 1PL1-1 and 1PL2-1 of the two paths on the package board for electrically connecting the first control signal solder ball B1 of each of the memory packages 400-1 to 400-n and the first control signal pin P and the NC pin P3 of the semiconductor memory device Mf1-1 may act as capacitance delaying a signal transfer time of the rank-wise connected signals CS1 or CKE1 output from the memory controller. According to a form in which the signal line of the clock signal CK and the command/address signal C/A causing a signal transfer time difference in the memory system having the double rank memory module structure is physically connected to two capacitors in parallel, the input capacitance viewed from the signal line may be twice as large as when only the first input buffer 420-1 is wired without the dummy buffer 440-1. The memory module according to the second example embodiment may compensate for a signal transfer time difference between semiconductor memory devices connected within the memory module without an additional control circuit for controlling the signal transfer time with the memory controller within the semiconductor memory device Mf1-1. In addition, since the first input buffer 420-1 and the dummy buffer 440-1 of the semiconductor memory device Mf1-1 may be connected using only the first control signal solder ball B1, i.e., without using the NC solder ball B3 of each of the memory packages 400-1 to 400-n, the NC solder ball B3 may be used for other purposes. Hence data processing capacity of the memory module may be increased.

The first input buffer 420-1 and the dummy buffer 440-1 of the semiconductor memory device Mf1-1 may be connected through the line patterns 1PL1-1 and 1PL2-1 on the package board using the first control signal pin P1 and the existing NC pin P3 of the semiconductor memory device Mf1-1. This may remove a design limitation on the number of pins of the memory module, may increase data processing capacity of the memory module, and may enable a memory system to operate at high speed.

As described above, conventionally, the NC pin P3 was not connected to anything. In contrast, according to embodiments, the semiconductor memory device Mf1 may simultaneously receive the rank-wise connected signals CS1 or CKE1 from the memory packet 300 through the first control signal pin P1 and the NC pin P3 and transfer the signals to the first input buffer 320-1 and the dummy buffer 340-1, thereby controlling the signal transfer time, and thereby overcoming a design limitation on the number of pins of the memory module. Further, conventionally, the NC solder ball B3 was not connected to anything. In contrast, according to embodiments, the first PCB line patterns 1ML1-1 and 1ML2-1 on the memory module board 100 for electrically connecting the first via contact 1VCf1 of the memory module board 100 and the first control signal solder ball B1 and the NC solder ball B3 of the memory package 300, and the line patterns on the memory package 300 for electrically connecting the first control signal solder ball B1 and the NC solder ball B3 and the first control signal pin P1 and the NC pin P3 of the semiconductor memory device Mf1, may act as capacitance delaying a signal transfer time of the rank-wise connected signals CS1 or CKE1 output from the memory controller.

A memory module according to embodiments may prevent skew between signals by compensating for a difference in signal transfer time using a dummy input buffer and existing pins, without an additional control means for varying input capacitance. Thus, an operating speed of a memory system and data processing capacity may be increased without increasing the size of a semiconductor memory device.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory module, comprising:
a memory module board; and
a plurality of memory devices on the memory module board, wherein:
the memory module board includes:
one or more first input terminals configured to receive first signals to individually control the memory devices; and
one or more second input terminals configured to receive second signals to commonly control the memory devices,
each of the memory devices includes:
a plurality of first signal input units configured to receive the first signals through one or more first input pins;
a plurality of second signal input units configured to receive the second signals through one or more third input pins; and
a plurality of dummy units, the dummy units being respectively connected to the first signal input units in parallel, and being configured to receive the first signals through one or more second input pins and to compensate for a signal line load,
the one or more first input terminals of the memory module board are commonly connected to the one or more first input pins of each of the memory devices as well as the one or more second input pins of each of the memory devices through a plurality of first signal lines, and the one or more second input terminals of the memory module board are connected to the one or more third input pins of each of the memory devices through a plurality of second signal lines.

2. The memory module as claimed in claim 1, wherein:

the one or more first input terminals of the memory module board receive the first signals from a memory controller;

the one or more second input terminals of the memory module board receive the second signals from the memory controller;

the first signal lines transfer the first signals to the one or more first input pins and the one or more second input pins of each of the memory devices using two paths via the one or more first input terminals; and the second signal lines transfer the second signals to the one or more third input pins of each of the memory devices using one path via the one or more second input terminals.

3. The memory module as claimed in claim 2, wherein:

the one or more first input pins and the one or more third input pins are first and second control signal pins, and the one or more second input pins use no connect (NC) input/output signal pins disposed adjacent to the first control signal pins.

4. The memory module as claimed in claim 3, wherein the first signal lines act as a delay capacitance that compensates for a signal transfer time difference of the first signals and the second signals.

5. The memory module as claimed in claim 4, wherein:

the first signals are connected from the memory controller according to memory rank, and the second signals are connected from the memory controller to each memory device of the plurality of memory devices.

6. The memory module as claimed in claim 5, further comprising a plurality of termination resistors, wherein the termination resistors are commonly connected to the one or more first input terminals or the one or more second input terminals.

7. A memory module, comprising:

a memory module board; and a plurality of memory packages on the memory module board, each of the memory packages including one or more first solder balls, one or more second solder balls, and a plurality of memory devices, wherein:

the memory module board includes:

one or more first input terminals configured to receive first signals to individually control the memory devices; and one or more second input terminals configured to receive second signals to commonly control the memory devices, each of the memory devices includes:

a plurality of first signal input units configured to receive the first signals through one or more first input pins;

a plurality of second signal input units configured to receive the second signals through one or more third input pins; and a plurality of dummy units, the dummy units being respectively connected to the first signal input units in parallel and being configured to receive the first signals through one or more second input pins and to compensate for a signal line load, the one or more first input terminals are commonly connected to the one or more first input pins and the one or more second input pins through a plurality of first signal lines, the one or more first solder balls, and a plurality of second signal lines, and the one or more second input terminals are connected to the one or more third input pins through a plurality of third signal lines, the one or more second solder balls, and a plurality of fourth signal lines.

8. The memory module as claimed in claim 7, wherein:

the one or more first input terminals of the memory module board are configured to receive the first signals from a memory controller;

the one or more second input terminals of the memory module board are configured to receive the second signals from the memory controller;

the first signal lines are configured to transfer the first signals to the one or more first solder balls of the memory packages via the one or more first input terminals; and the third signal lines are configured to transfer the second signals to the one or more second solder balls of the memory packages via the one or more second input terminals.

9. The memory module as claimed in claim 8, wherein:

the one or more first solder balls of each of the memory packages is configured to receive the first signals;

the one or more second solder balls of each of the memory packages is configured to receive the second signals;

the second signal lines are included in each of the memory packages and are configured to transfer the first signals to two paths via the one or more first solder balls; and the fourth signal lines are included in each of the memory packages and are configured to transfer the second signals to each of the memory devices using one path via the one more second solder balls.

10. The memory module as claimed in claim 9, wherein:

the one or more first solder balls and the one or more third solder balls are first and second control signal balls, and the one or more second solder balls use NC input/output signal balls disposed adjacent to the first control signal balls.

11. The memory module as claimed in claim 10, wherein the one or more first input pins and the one or more third input pins are first and second control signal pins, and the one or more second input pins use NC input/output signal pins disposed adjacent to the first control signal pins.

12. The memory module as claimed in claim 11, wherein the second signal lines act as a delay capacitance that compensates for a signal transfer time difference of the first signals and the second signals.

13. The memory module as claimed in claim 12, wherein each of the memory packages is configured as a package other than a ball grid array package.

14. The memory module as claimed in claim 13, wherein:

the first signals are connected from the memory controller according to memory rank, and the second signals are connected from the memory controller to all of the memory devices of the plurality of memory devices.

15. The memory module as claimed in claim 14, further comprising a plurality of termination resistors, wherein the termination resistors are commonly connected to the one or more first input terminals or the one or more second input terminals.

* * * * *